(12) United States Patent
Hosaka et al.

(10) Patent No.: US 10,261,136 B2
(45) Date of Patent: Apr. 16, 2019

(54) BATTERY DEGRADATION DEGREE ESTIMATION DEVICE AND BATTERY DEGRADATION DEGREE ESTIMATION METHOD

(71) Applicant: Nissan Motor Co., Ltd., Yokohama-Shi, Kanagawa (JP)

(72) Inventors: Kenji Hosaka, Kanagawa (JP); Kazuma Tamai, Kanagawa (JP); Chizuru Matsuyama, Kanagawa (JP); Kenichi Sakai, Kanagawa (JP)

(73) Assignee: Nissan Motor Co., Ltd., Yokohama-shi, Kanagawa (JP)

( * ) Notice: Subject to any disclaimer, the term of this patent is extended or adjusted under 35 U.S.C. 154(b) by 0 days.

(21) Appl. No.: 15/323,321

(22) PCT Filed: May 28, 2015

(86) PCT No.: PCT/JP2015/065360
§ 371 (c)(1),
(2) Date: Dec. 30, 2016

(87) PCT Pub. No.: WO2016/002398
PCT Pub. Date: Jan. 7, 2016

(65) Prior Publication Data
US 2017/0131364 A1 May 11, 2017

(30) Foreign Application Priority Data
Jul. 1, 2014 (JP) .................................. 2014-136070

(51) Int. Cl.
*G01R 31/36* (2019.01)
*G01R 31/392* (2019.01)
(Continued)

(52) U.S. Cl.
CPC .......... *G01R 31/392* (2019.01); *G01R 31/36* (2013.01); *H01M 10/48* (2013.01);
(Continued)

(58) Field of Classification Search
CPC ............ G01R 31/3679; G01R 31/3651; G01R 31/3606; H01M 10/48; H01M 2220/20
See application file for complete search history.

(56) References Cited

U.S. PATENT DOCUMENTS

2005/0017686 A1* 1/2005 Sakakibara ........ G01R 31/3679
320/132
2010/0324846 A1* 12/2010 Marsh ................ G01R 31/3679
702/63
(Continued)

FOREIGN PATENT DOCUMENTS

JP 2004014205 A 1/2004
JP 2007195312 A 8/2007
(Continued)

*Primary Examiner* — Mischita L Henson
*Assistant Examiner* — Christine Y Liao
(74) *Attorney, Agent, or Firm* — Young Basile Hanlon & MacFarlane, P.C.

(57) ABSTRACT

A battery degradation degree estimation device includes a total degradation degree detection unit configured to detect a present total degradation degree of a battery, a cycle degradation estimation unit configured to estimate a future cycle degradation degree due to charge/discharge of the battery, a storage degradation estimation unit configured to estimate a future storage degradation degree over time inside the battery, and a battery degradation estimation unit configured to estimate a future battery degradation degree on the basis of the present total degradation degree, the future cycle degradation degree and the future storage degradation degree.

14 Claims, 17 Drawing Sheets

(51) Int. Cl.
*H01M 10/48* (2006.01)
*G01R 31/382* (2019.01)
*G01R 31/3842* (2019.01)

(52) U.S. Cl.
CPC ......... *H01M 10/486* (2013.01); *G01R 31/382* (2019.01); *G01R 31/3842* (2019.01)

(56) References Cited

U.S. PATENT DOCUMENTS

| | | |
|---|---|---|
| 2012/0112700 A1 | 5/2012 | Morimoto et al. |
| 2013/0057291 A1* | 3/2013 | Takahashi .......... G01R 31/3662 324/427 |
| 2013/0103333 A1* | 4/2013 | Nishida ............... H01M 10/482 702/63 |
| 2015/0360578 A1* | 12/2015 | Duan .................. B60L 11/1861 340/455 |
| 2016/0011274 A1* | 1/2016 | Morita .................. H02J 7/0021 702/63 |

FOREIGN PATENT DOCUMENTS

| | | |
|---|---|---|
| JP | 2011142036 A | 7/2011 |
| JP | 2013077054 A | 4/2013 |
| JP | 2013210340 A | 10/2013 |
| WO | 2011004550 A1 | 1/2011 |

\* cited by examiner

BATTERY DEGRADATION DEGREE ESTIMATION DEVICE AND BATTERY DEGRADATION DEGREE ESTIMATION METHOD

CROSS REFERENCE TO RELATED APPLICATION

The entire content of Japanese Patent Application No. 2014-136070 (filed on Jan. 7, 2014) in which the priority right of the present patent application is claimed is herein incorporated by reference.

TECHNICAL FIELD

This invention relates to a battery degradation degree estimation device and a battery degradation degree estimation method.

BACKGROUND

A battery (secondary battery) is degraded at a speed corresponding to a usage environment. With degradation, a charge amount at the time of full charge (hereinafter, referred to as "full charge capacity" as appropriate) decreases and a discharge characteristic is reduced. If a battery mounted in a vehicle is degraded, traveling performance is reduced. Thus, it is desirable to estimate a period (remaining life) during which the battery can exhibit predetermined performance. In a technique described in JP2007-195312A, a remaining life is predicted by estimating a degradation degree of a battery in association with a square root of a total traveling distance.

SUMMARY

However, the inventors of the present application found out a problem that an error was large even if a battery degradation degree was estimated by the technique disclosed in JP2007-195312A.

The present invention was developed, focusing on such a conventional problem and aims to provide a technique capable of accurately estimating a battery degradation degree.

The present invention solves the above problem by the following solution.

A battery degradation degree estimation device according to an aspect of the present invention includes: a total degradation degree detection unit configured to detect a present total degradation degree of a battery; a cycle degradation estimation unit configured to estimate a future cycle degradation degree due to charge/discharge of the battery; and a storage degradation estimation unit configured to estimate a future storage degradation degree over time inside the battery. The battery degradation degree estimation device estimates a future battery degradation degree on the basis of the present total degradation degree, the future cycle degradation degree and the future storage degradation degree.

DETAILED DESCRIPTION OF THE EMBODIMENTS

Hereinafter, embodiments of the present invention are described with reference to the accompanying drawings.

(Basic Concept)

As described above, it is desirable to estimate a remaining life of a battery as accurately as possible. However, an error was large even if a degradation degree of a battery was merely estimated in association with a square root of a total traveling distance. By repeating intensive research on this, the inventors found out that there were storage degradation and cycle degradation. The storage degradation is degradation mainly due to a chemical reaction occurring inside a battery over time. The storage degradation progresses, for example, due to a chemical reaction between electrodes and an electrolyte of the battery. A degree of progress of this storage degradation is associated with a square root of time. In contrast, the cycle degradation is degradation due to repeated charge and discharge of the battery. The cycle degradation mainly mechanically progresses such as due to the friction of the electrodes or the like resulting from the thermal expansion of the inside of the battery when the battery is charged/discharged. A degree of progress of the cycle degradation is associated with the number of charges and discharges (cycle). Thus, with a technique for estimating a degradation degree of the battery merely in association with a square root of the total traveling distance, estimation can be roughly made, but an error is large. Thus, it has been difficult to accurately estimate. The inventors completed the invention on the basis of such a knowledge. The invention is described in detail below.

First Embodiment

Figure 1:
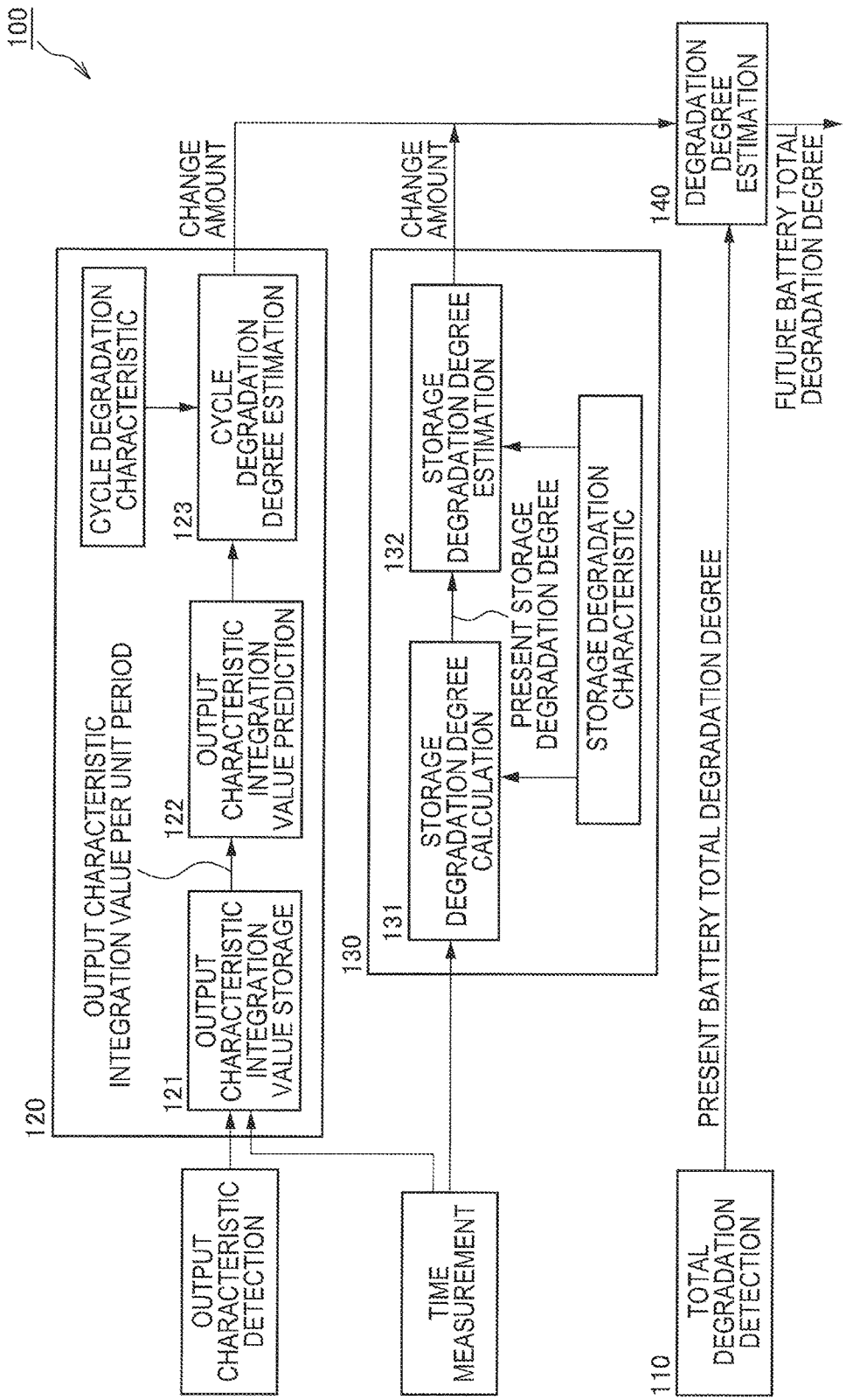
FIG. 1 is a block diagram showing control contents of a first embodiment of a battery degradation degree estimation device according to the present invention.

FIG. 1 is a block diagram showing control contents of a first embodiment of a battery degradation degree estimation device according to the present invention.

A battery degradation degree estimation device 100 includes a total degradation degree detection unit 110, a cycle degradation estimation unit 120, a storage degradation estimation unit 130 and a battery degradation estimation unit 140.

The total degradation degree detection unit 110 detects a present battery total degradation degree, which is a combination of cycle degradation and storage degradation. This is described in detail later.

The cycle degradation estimation unit 120 estimates a future cycle degradation degree due to the charge and discharge of a battery. As described above, the cycle degradation is degradation which mainly mechanically progresses such as due to the friction of electrodes or the like resulting from the thermal expansion of the inside of the battery when the battery is charged/discharged. Accordingly, the cycle degradation estimation unit 120 predicts a future charge/discharge number (hereinafter, referred to as a cycle) on the basis of a charge/discharge number of the battery within a fixed time (unit period) and estimate future cycle degradation. It should be noted that the charge/discharge number of the battery within the fixed period can be thought as an integration value of an output characteristic (e.g. power or current) within the fixed period. Thus, in the present embodiment, the future cycle degradation is estimated on the basis of the integration value of the output characteristic. The cycle degradation estimation unit 120 includes an output characteristic integration value storage unit 121, an output characteristic integration value prediction unit 122 and a cycle degradation degree estimation unit 123.

The output characteristic integration value storage unit 121 stores the last integration value per fixed period (unit period) of the output characteristic (e.g. power or current) detected by an output characteristic detection unit. As described above, the charge/discharge number of the battery within the fixed period (unit period) can be thought as the integration value of the output characteristic within the fixed period. Accordingly, the output characteristic integration value storage unit 121 stores the charge/discharge number of the battery within the fixed period. Here, the output characteristic detection unit is specifically a current sensor for detecting a current of the battery or a voltage sensor for detecting a voltage. By such a sensor, a current value/voltage value of an input/output is detected and power is detected. The output characteristic integration value may be any of an integration value of charging power [kWh], an integration value of discharging power [kWh], an integration value of an absolute value of charging power and discharging power [kWh], an integration value of charging current [Ah], an integration value of discharging current [Ah] and an integration value of an absolute value of charging current and discharging current [Ah]. By appropriate selection, estimation accuracy can be increased without increasing cost. Further, the unit period to be stored can be arbitrarily set. However, a long period is more desirable than a short period. If a short period is set, there is a possibility of including noise. Further, in the case of changing a vehicle owner, the unit period is desirably reset. This is because a power integration state changes if the vehicle owner is changed.

The output characteristic integration value prediction unit 122 calculates (predicts) an integration value (future value) of the output characteristic after a desired period by multiplying the integration value of the output characteristic per unit period by the desired period.

Figure 2:
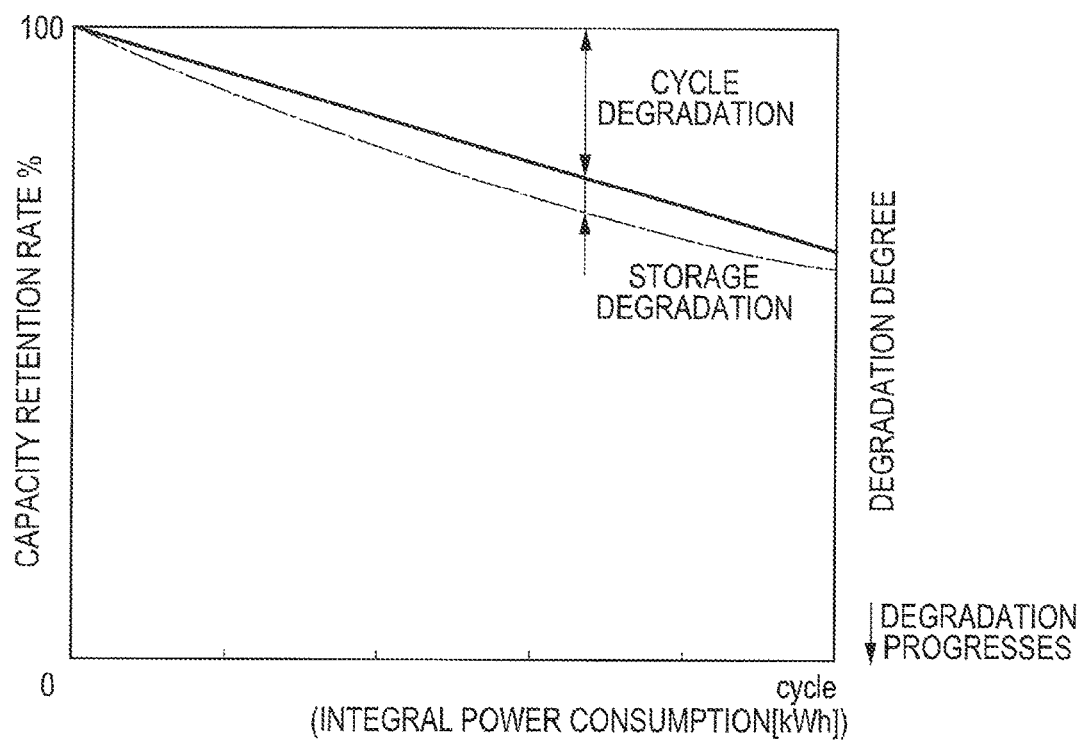
FIG. 2 is a graph showing a method for setting a cycle degradation characteristic.

The cycle degradation estimation unit 123 estimates a cycle degradation change amount after the desired period (change amount from the present degradation degree) on the basis of the integration value of the output characteristic after the desired period and a cycle degradation characteristic set in advance. It should be noted that the cycle degradation characteristic is a characteristic shown in FIG. 2 and stored in advance in a storage medium provided in a controller. Here, a method for setting the cycle degradation characteristic is described with reference to FIG. 2. A relationship between the cycle and the degradation degree is plotted by conducting a general cycle test on battery evaluation in which a battery is repeatedly charged/discharged. It should be noted that the storage degradation progresses due to a chemical reaction between electrodes and an electrolyte of the battery also during this cycle test. Accordingly, as shown in FIG. 2, it is important to set the cycle degradation characteristic by excluding a storage degradation component during the cycle test. If the cycle degradation characteristic is plotted in this way, it is found that a capacity retention rate is reduced as cycles increase. Specifically, the cycle degradation is found to progress in proportion to the cycle.

The storage degradation estimation unit 130 estimates a future storage degradation degree mainly due to a chemical reaction occurring over time inside the battery. As described above, the storage degradation is degradation which progresses over time, for example, due to the chemical reaction between the electrodes and the electrolyte of the battery and progresses with the passage of time from a point of time when the electrodes contact the electrolyte. Accordingly, the storage degradation estimation unit 130 measures an elapsed period from the contact of the electrodes with the electrolyte, obtains the present storage degradation degree on the basis of that period, obtains the storage degradation degree after the desired period and estimates a storage degradation change amount after the desired period (change amount from the present degradation degree). The storage degradation estimation unit 130 includes a storage degradation degree calculation unit 131 and a storage degradation degree estimation unit 132.

Figure 3:
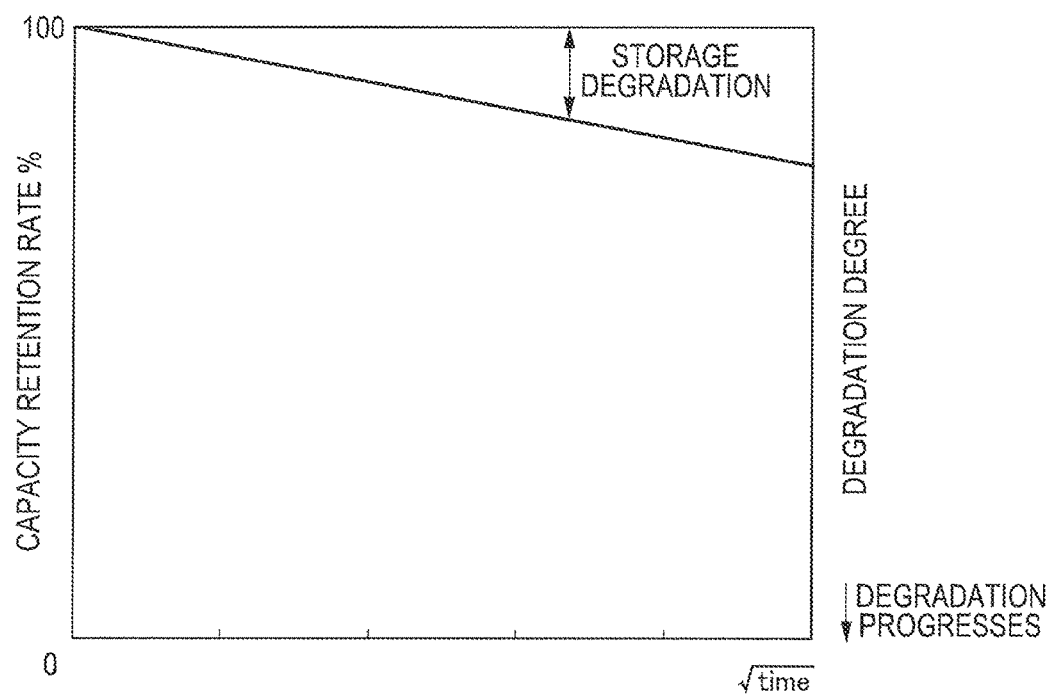
FIG. 3 is a graph showing an example of a storage degradation characteristic.

The storage degradation degree calculation unit 131 obtains the present storage degradation degree on the basis of the elapsed time from the point of time when the electrodes contact the electrolyte and a storage degradation characteristic set in advance. It should be noted that the storage degradation characteristic is, for example, a characteristic shown in FIG. 3 and stored in advance in the storage medium provided in the controller. Such a characteristic can be obtained by a general storage test on battery evaluation. It is found from FIG. 3 that the storage degradation is a characteristic which progresses in proportion to a square root of time. A time measurement unit is a timer mounted in a vehicle. Thus, time cannot be measured until time measurement is started by the vehicle timer after the electrodes contact the electrolyte in a battery manufacturing process. Accordingly, a time until time measurement is started by the vehicle timer after the electrodes contact the electrolyte is controlled to be a fixed time and that fixed time may be added to the time measured by the timer. It should be noted that the time until time measurement is started by the vehicle timer after the electrodes contact the electrolyte can also be ignored since it is very short in comparison to a life of the battery.

The storage degradation degree estimation unit 132 obtains the storage degradation degree after the desired period on the basis of the storage degradation characteristic and estimates a storage degradation change amount after the desired period.

Figure 4:
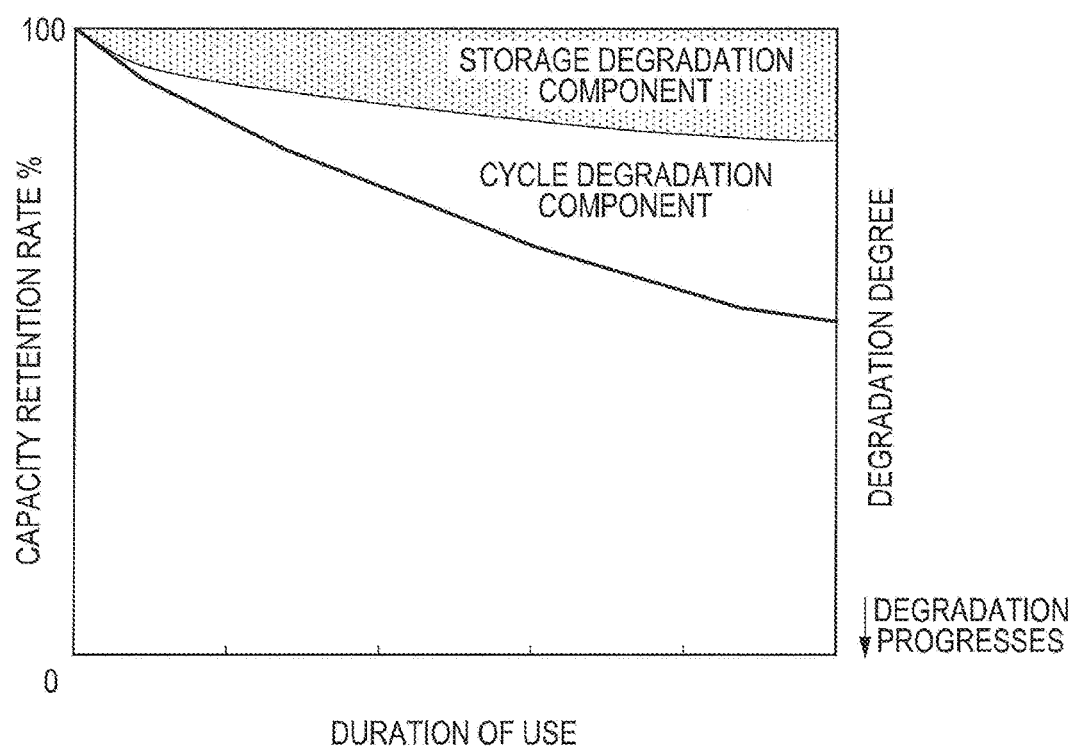
FIG. 4 is a graph showing an example of an estimation result of a future battery degradation degree.

The battery degradation estimation unit 140 estimates a future battery degradation degree on the basis of the present total degradation degree, the cycle degradation change amount after the desired period and the storage degradation change amount after the desired period. An estimation result is, for example, as shown in FIG. 4.

Figure 5:
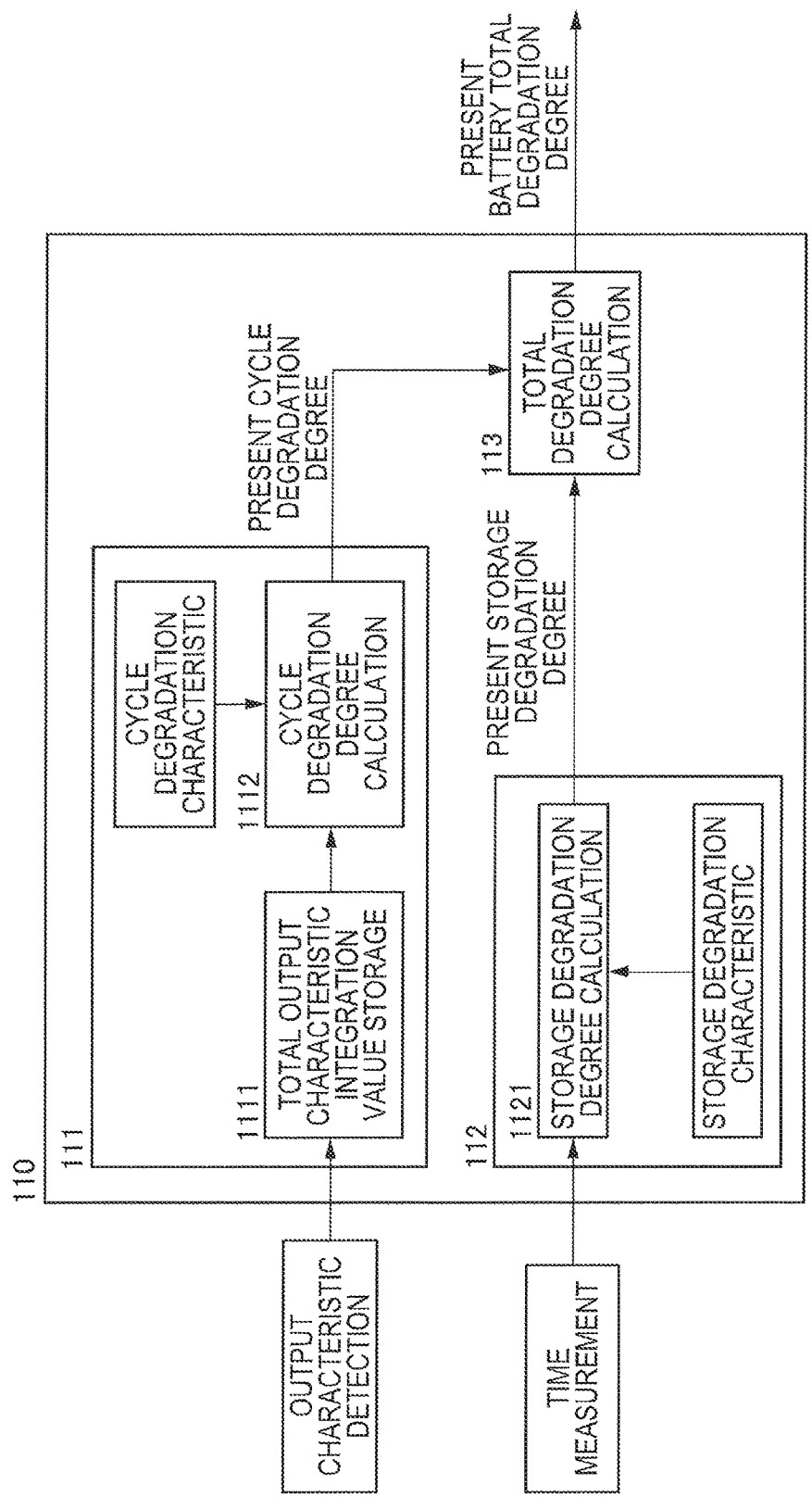
FIG. 5 is a block diagram showing control contents of a total degradation degree detection unit 110.

FIG. 5 is a block diagram showing control contents of the total degradation degree detection unit 110.

The total degradation degree detection unit 110 detects the battery total degradation degree at present by adding both the cycle degradation and the storage degradation. The total degradation degree detection unit 110 includes a cycle degradation calculation unit 111, a storage degradation calculation unit 112 and a total degradation calculation unit 113.

The cycle degradation calculation unit 111 calculates a cycle degradation degree at present due to the charge and discharge of the battery. The cycle degradation calculation unit 111 includes a total output characteristic integration value storage unit 1111 and a cycle degradation degree calculation unit 1112.

The total output characteristic integration value storage unit 1111 stores an integration value of the output characteristic detected thus far by the output characteristic detection unit. It should be noted that the output characteristic detection unit is specifically a current sensor for detecting a current of the battery or a voltage sensor for detecting a voltage. By such a sensor, a current value/voltage value of an input/output is detected and power is detected. Further, the output characteristic integration value may be any of an integration value of charging power [kWh], an integration value of discharging power [kWh], an integration value of an absolute value of charging power and discharging power [kWh], an integration value of charging current [Ah], an integration value of discharging current [Ah] and an integration value of an absolute value of charging current and discharging current [Ah].

The cycle degradation degree calculation unit 1112 calculates a cycle degradation degree at present on the basis of the total output characteristic integration value and the cycle degradation characteristic set in advance. It should be noted that the cycle degradation characteristic is as described above.

The storage degradation calculation unit 112 calculates a storage degradation degree at present mainly due to the chemical reaction occurring over time regardless of the charge/discharge inside the battery. The storage degradation calculation unit 112 includes a storage degradation degree calculation unit 1121.

The storage degradation degree calculation unit 1121 obtains a storage degradation degree at present on the basis of the elapsed time from the point of time when the electrodes contact the electrolyte and the storage degradation characteristic set in advance. It should be noted that the storage degradation characteristic is as described above.

The total degradation calculation unit 113 calculates the present total degradation degree on the basis of the cycle degradation degree at present and the storage degradation degree at present.

Figure 6:
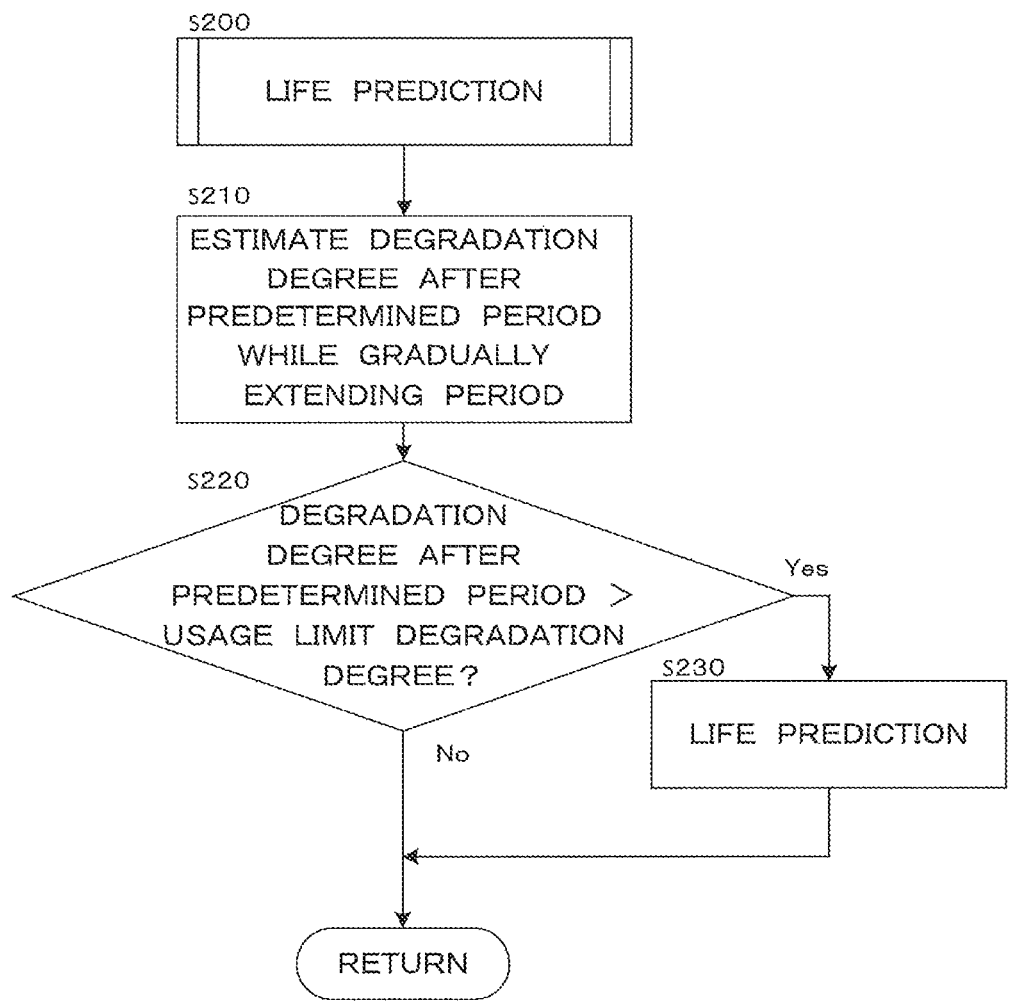
FIG. 6 is a flow chart of a life prediction routine executed by a controller of the battery degradation degree estimation device.

FIG. 6 is a flow chart of a life prediction routine executed by the controller of the battery degradation degree estimation device. The controller repeatedly executes this routine.

In Step S210, the controller estimates the degradation degree after a predetermined period while gradually extending the period. Specifically, the degradation degrees after one month, two months, three months and the like are estimated.

In Step S220, the controller determines whether or not the degradation degree after the predetermined period has exceeded a usage limit degradation degree. The controller temporarily exits from this process if a determination result is negative. If the determination result is affirmative, the controller performs a processing of Step S230.

In Step S230, the controller predicts a period as a remaining life when the degradation degree estimated in Step S210 exceeded the usage limit degradation degree for the first time.

It should be noted that a traveling distance until the remaining life is reached may be predicted instead of obtaining the remaining life (period) of the battery. Specifically, the traveling distance is predicted as follows.

Figure 7:
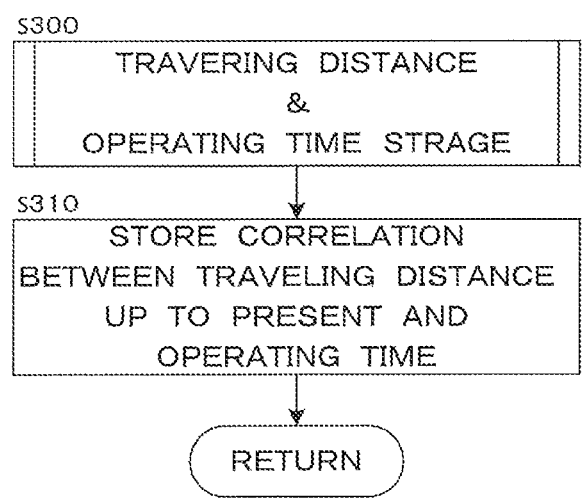
FIG. 7 is a flow chart of a traveling distance & operating time storage routine executed by the controller of the battery degradation degree estimation device.

FIG. 7 is a flow chart of a traveling distance & operating time storage routine executed by the controller of the battery degradation degree estimation device.

In Step S310, the controller stores a correlation between a traveling distance up to present and an operating time.

Figure 8:
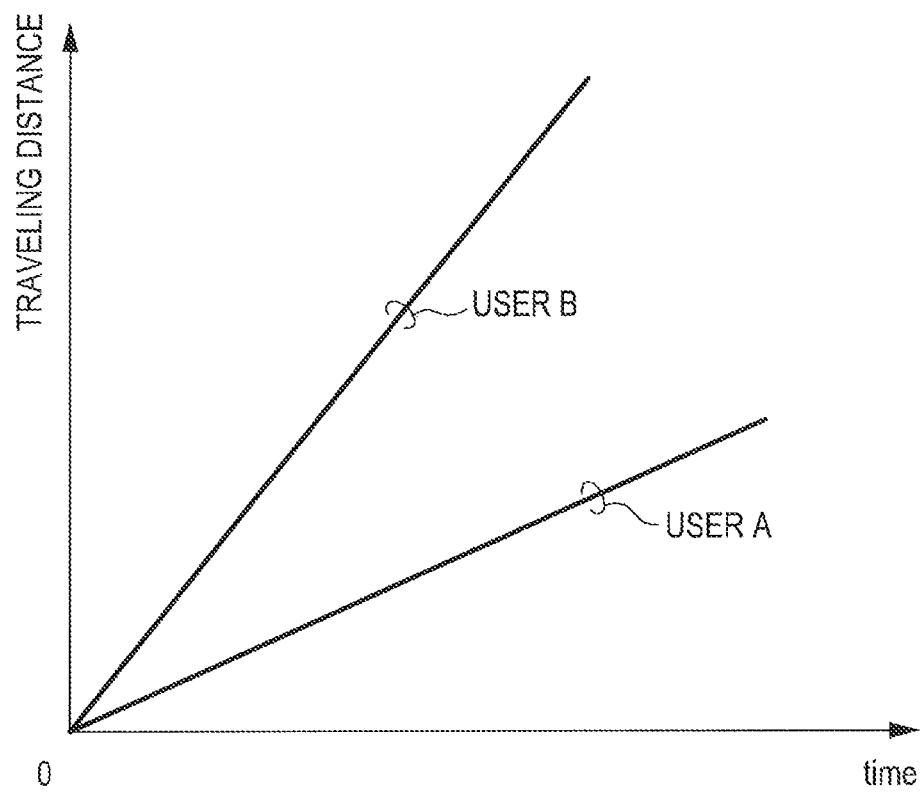
FIG. 8 is a graph showing an example of a correlation between the traveling time and the operating time stored by the controller.

FIG. 8 is a graph showing an example of the correlation between the traveling distance and the operating time stored in the controller.

In Step S310, data shown in FIG. 8 is, for example, stored in the controller. Roughly, the traveling distance is proportional to the operating time.

Figure 9:
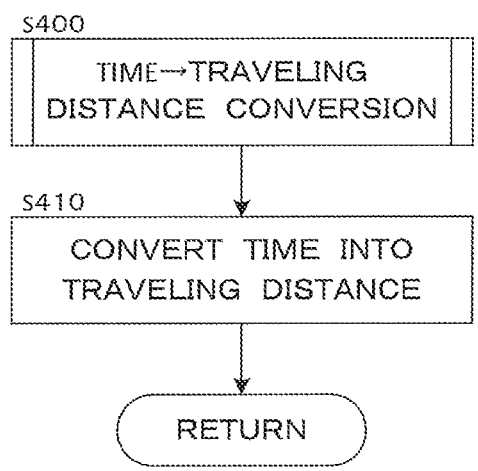
FIG. 9 is a flow chart of a traveling distance & operating time storage routine executed by the controller of the battery degradation degree estimation device.

FIG. 9 is a flow chart of a traveling distance & operating time storage routine executed by the controller of the battery degradation degree estimation device.

In Step S410, the controller converts the remaining life into an expected traveling distance on the basis of the correlation stored in Step S310.

It should be noted that the correlation between the traveling distance and the operating time differs depending on users in many cases as shown in FIG. 8. Accordingly, it is preferable to reset the data and store the correlation again at a timing which a user is changed.

As described above, in the present embodiment, the battery degradation degree is not estimated merely in association with a square root of a total traveling distance. In the present embodiment, the degradation is mainly divided into the storage degradation that progresses over time mainly due to the chemical reaction between the electrodes and the electrolyte of the battery and the cycle degradation that mechanically progresses such as due to the friction of the electrodes or the like resulting from the thermal expansion of the battery inside when the battery is charged/discharged, and each degradation is estimated. By doing so, it is possible to accurately estimate after how many years from now and to which degree the battery will be degraded, how much the remaining life of the battery is or how much the vehicle can still travel.

Further, in the present embodiment, the battery total degradation degree when both the cycle degradation and the storage degradation are added is detected by the technique shown in FIG. 5. In this way, the present battery total degradation degree can be detected without requiring a special device.

Second Embodiment

Figure 10:
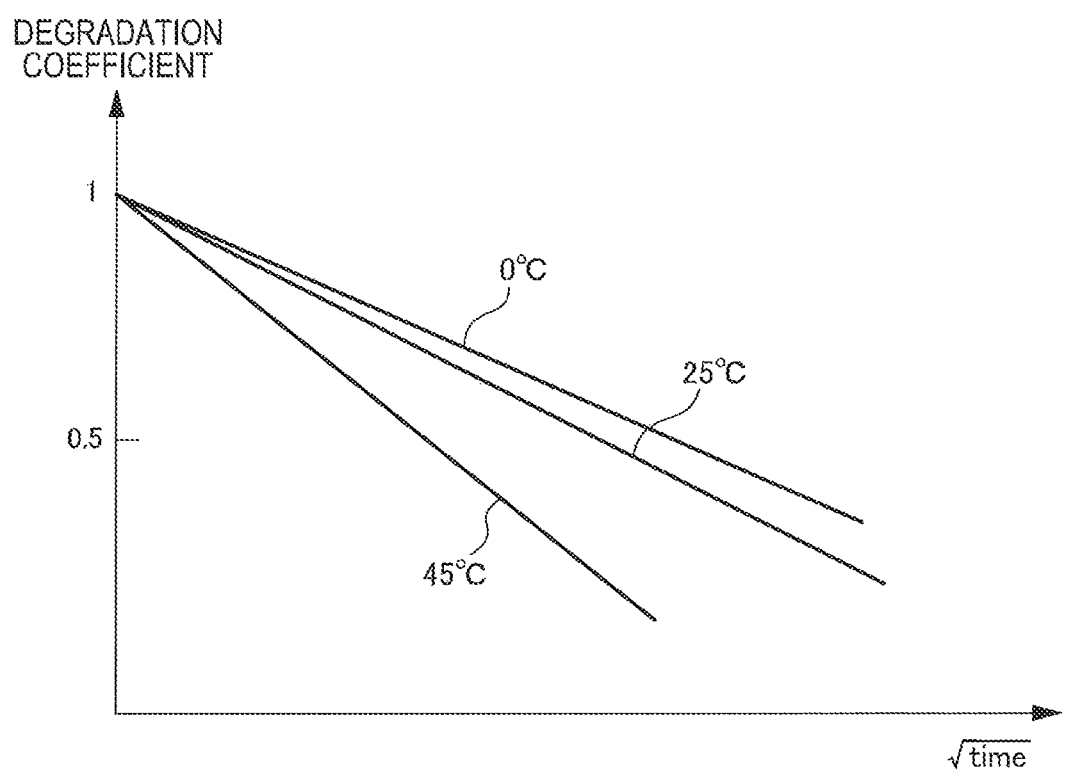
FIG. 10 is a graph showing a concept of a second embodiment.

FIG. 10 is a graph showing a concept of a second embodiment.

As described above, a degree of progress of storage degradation is associated with a square root of time and, besides that, sensitive to temperature. For example, as shown in FIG. 10, degradation is likely to progress as temperature increases. It should be noted that a degradation coefficient on a vertical axis is a coefficient to be multiplied with a capacity retention rate. The smaller the degradation coefficient, the smaller the capacity retention rate, i.e. the larger the degradation degree. In the present embodiment, storage degradation is calculated, further considering a temperature history (temperature occurrence frequency) thus far. A specific configuration is described with reference to FIG. 11.

Figure 11:
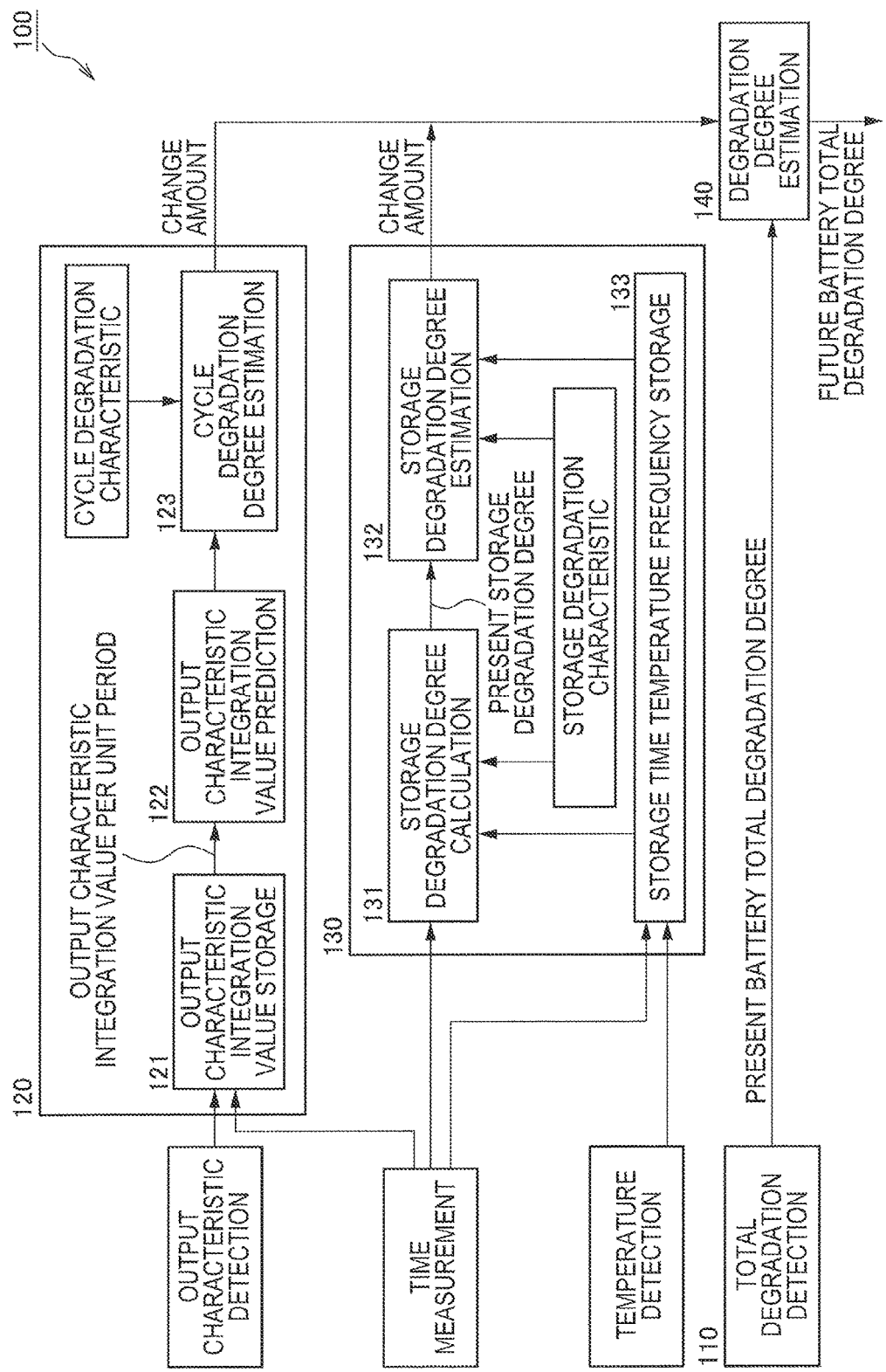
FIG. 11 is a block diagram showing control contents of the second embodiment of the battery degradation degree estimation device according to the present invention.

FIG. 11 is a block diagram showing control contents of the second embodiment of the battery degradation degree estimation device according to the present invention.

It should be noted that components fulfilling functions similar to the above are denoted by the same reference signs and repeated description is omitted as appropriate.

In the present embodiment, a storage degradation estimation unit 130 further includes a storage time temperature frequency storage unit 133 in addition to the configuration of the first embodiment. The storage time temperature frequency storage unit 133 stores a past temperature frequency by a fixed period on the basis of temperature information output from a temperature detection unit (battery temperature sensor) and time information of a time measurement unit. It should be noted that since a vehicle battery is a battery pack, it is better for the temperature detection unit to measure a temperature at a hottest position where degradation progresses fast. A thermistor or the like may be used as the temperature detection unit.

A storage degradation degree calculation unit 131 and a storage degradation degree estimation unit 132 correct a storage degradation using the temperature information stored in the storage time temperature frequency storage unit 133. Specifically, the degradation degree is integrated by obtaining an exposure time to that temperature using the stored temperature occurrence frequency information.

By doing so, temperature sensitivity serving as an important factor of the storage degradation of the battery can be applied. Thus, the battery storage degradation degree can be estimated with higher accuracy. As a result, a remaining life of the battery can be more accurately estimated. It should be noted that since the temperature sensitivity can be ignored in some cases depending on characteristics of the battery, the present embodiment may be appropriately applied according to the characteristics of the battery. Further, the concept of this embodiment may be applied to the storage degradation degree calculation unit 1121 of the storage degradation calculation unit 112 of the total degradation degree detection unit 110.

Third Embodiment

Figure 12:
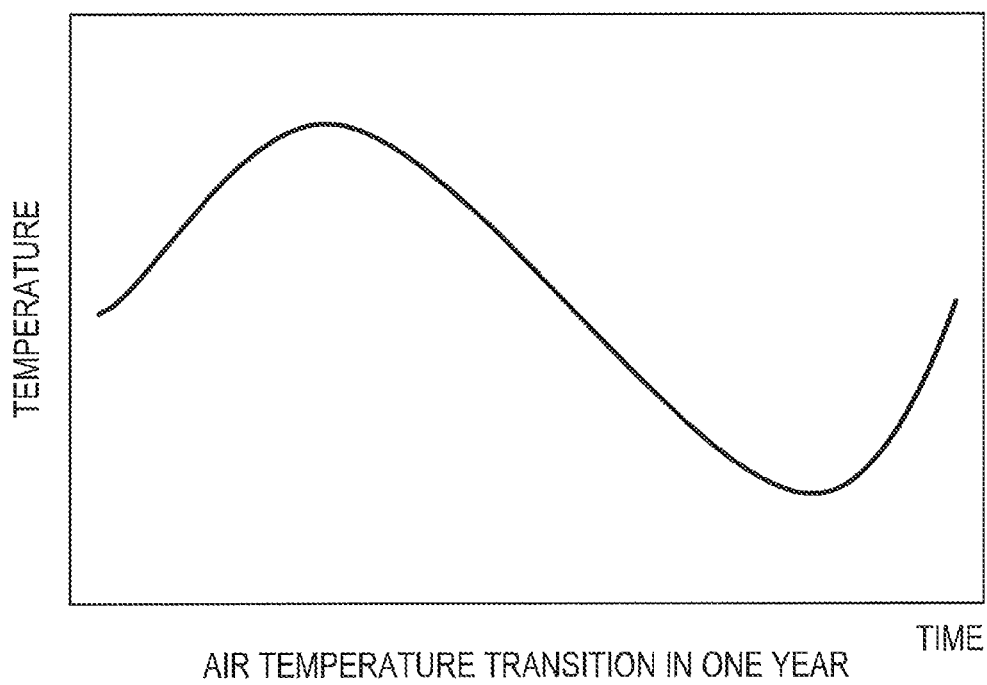
FIG. 12 is a graph showing a concept of a third embodiment.

FIG. 12 is a graph showing a concept of a third embodiment.

Battery temperature transitions in dependence on outside temperature. Accordingly, as shown in FIG. 12, a temperature change caused by a seasonal variation constituting one cycle in one year is considered by considering a temperature transition in the past year. In this way, the battery storage degradation degree can be estimated with higher accuracy and the remaining life of the battery can be more accurately estimated.

Fourth Embodiment

Figure 13:
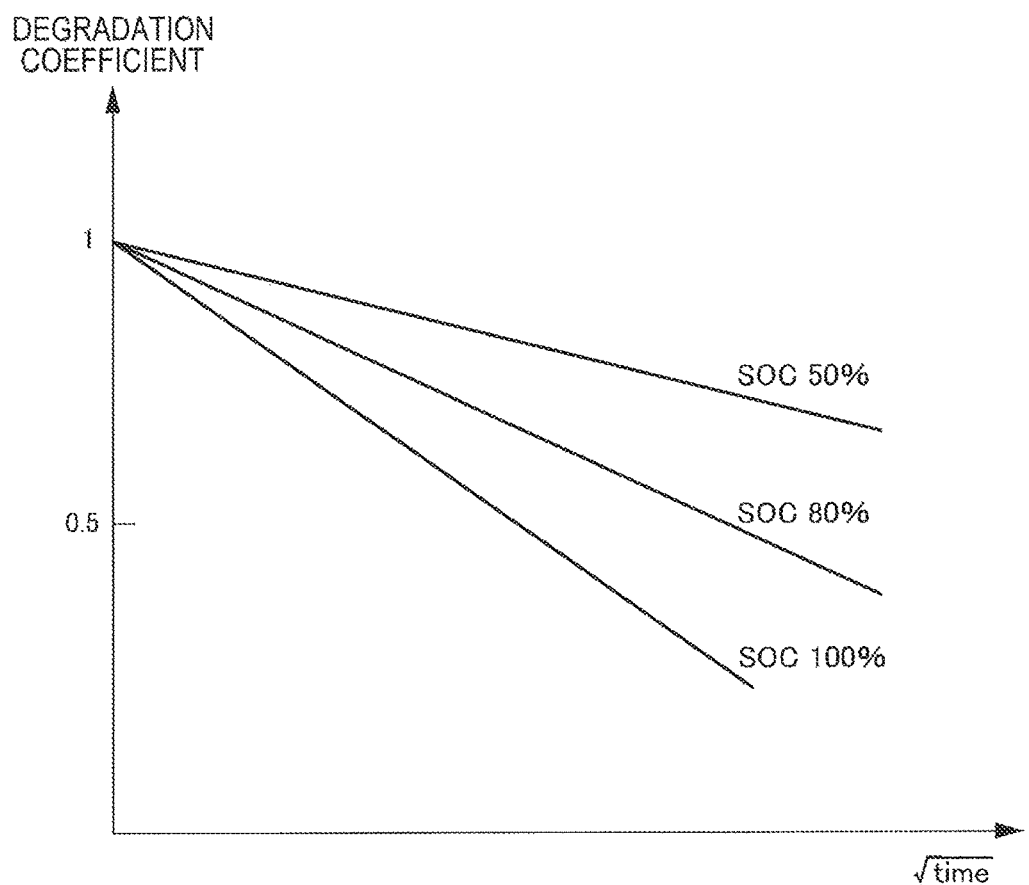
FIG. 13 is a graph showing a concept of a fourth embodiment.

FIG. 13 is a graph showing a concept of a fourth embodiment.

As described above, a degree of progress of storage degradation is associated with a square root of time and, besides that, sensitive to a battery charge rate SOC (state of charge). For example, as shown in FIG. 13, degradation is likely to progress as the SOC increases. Accordingly, in the present embodiment, storage degradation is calculated, further considering a past SOC history (SOC occurrence frequency). A specific configuration is described with reference to FIG. 14.

Figure 14:
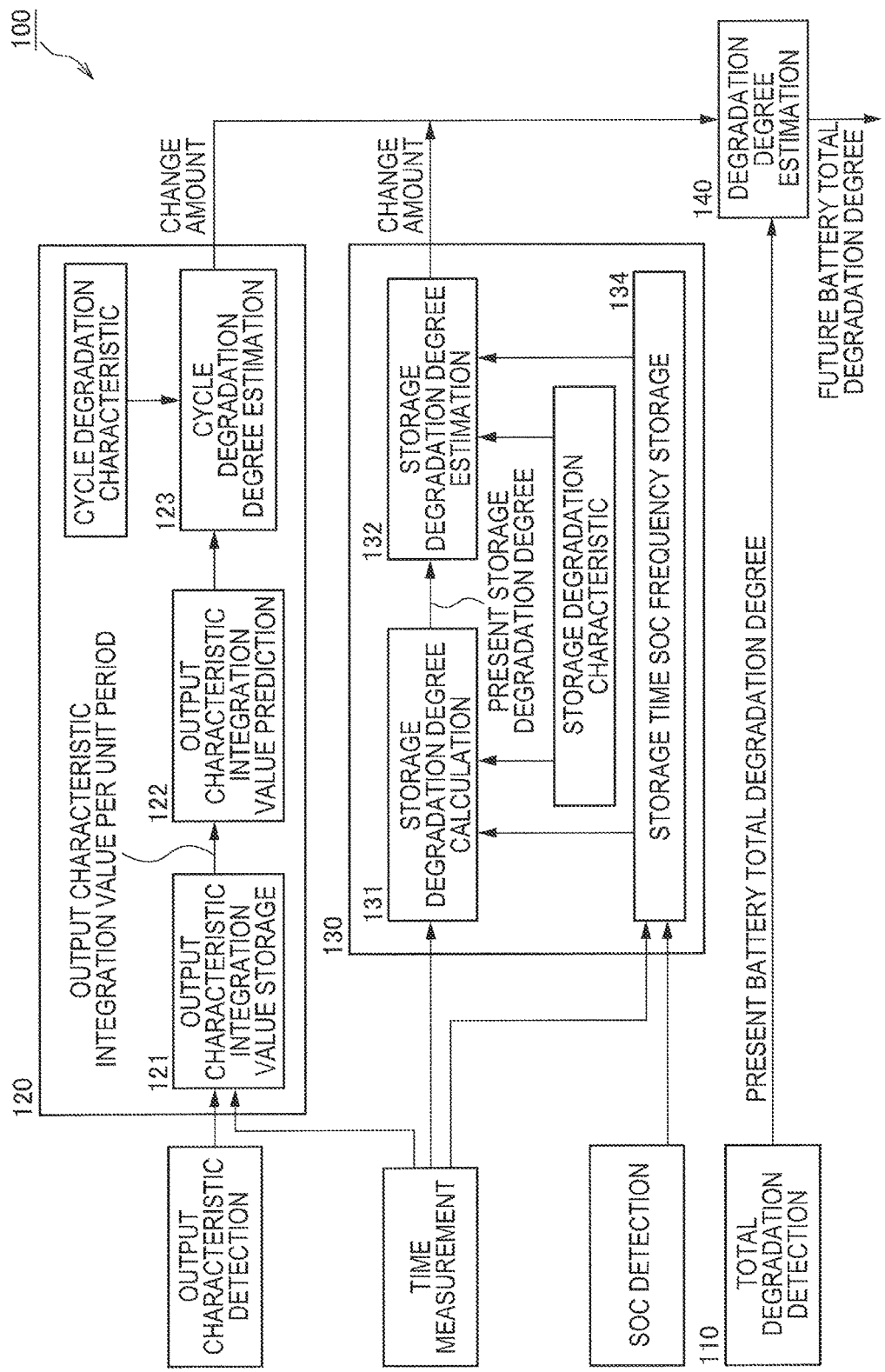
FIG. 14 is a block diagram showing control contents of the fourth embodiment of the battery degradation degree estimation device according to the present invention.

FIG. 14 is a block diagram showing control contents of the fourth embodiment of the battery degradation degree estimation device according to the present invention.

In the present embodiment, a storage degradation estimation unit 130 further includes a storage time SOC frequency storage unit 134 in addition to the configuration of the first embodiment. The storage time SOC frequency storage unit 134 stores a past frequency of SOC by a fixed period on the basis of SOC information output by an SOC detection unit and time information of a time measurement unit. It should be noted that a general method such as a method for measuring a voltage in the absence of polarization by energization and calculating a present SOC from a relationship of a voltage and the SOC, a method for calculating an SOC from an energization amount measured such as by an ammeter or the like may be employed as an SOC detection method.

A storage degradation degree calculation unit 131 and a storage degradation degree estimation unit 132 correct a storage degradation degree using the SOC information stored in the storage time SOC frequency storage unit 134. Specifically, the degradation degree is integrated by obtaining a time, during which the battery is exposed to that SOC, using the stored SOC occurrence frequency information.

By doing so, SOC sensitivity serving as an important factor of the storage degradation of the battery can be applied. Thus, the battery storage degradation degree can be estimated with higher accuracy. In this way, a remaining life of the battery can be more accurately estimated. It should be noted that the SOC sensitivity can be ignored in some cases depending on characteristics of the battery. Thus, the present embodiment may be appropriately applied according to the characteristics of the battery. Further, the concept of this embodiment may be applied to the storage degradation degree calculation unit 1121 of the storage degradation calculation unit 112 of the total degradation degree detection unit 110.

Fifth Embodiment

Figure 15:
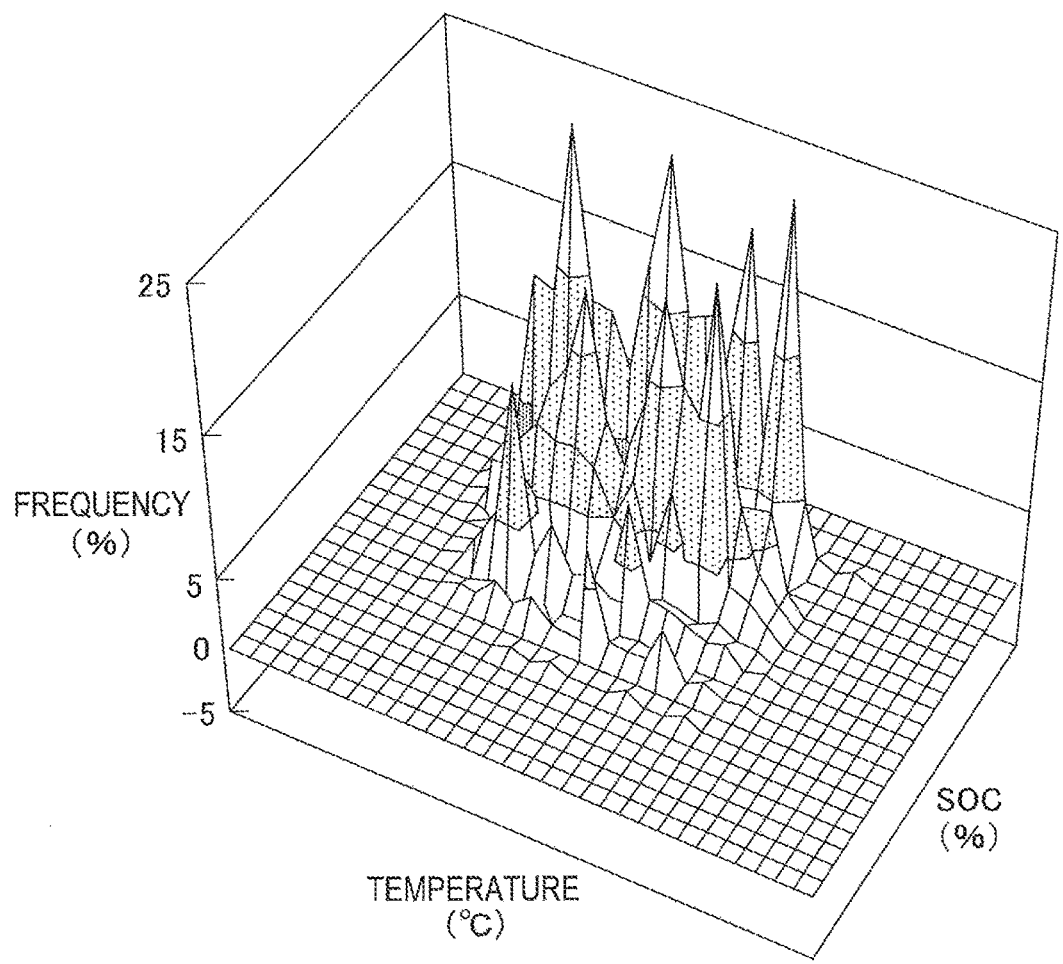
FIG. 15 is a graph showing a concept of a fifth embodiment.

FIG. 15 is a graph showing a concept of a fifth embodiment.

This fifth embodiment is a combination of the second and fourth embodiments. As shown in FIG. 15, temperature and an SOC occurrence frequency are mapped and stored. A storage degradation degree calculation unit 131 and a storage degradation degree estimation unit 132 integrate a degradation degree by obtaining a time, during which a battery is exposed to the stored temperature and SOC occurrence frequency information, and correct the storage degradation, using those temperature and SOC occurrence frequency information.

By doing so, temperature and SOC sensitivity serving as important factors of the storage degradation of the battery can be applied. Thus, the battery storage degradation degree can be estimated with higher accuracy. In this way, a remaining life of the battery can be more accurately estimated. It should be noted that the temperature and the SOC sensitivity can be ignored in some cases depending on characteristics of the battery. Thus, the present embodiment may be appropriately applied according to the characteristics of the battery. Further, the concept of this embodiment may be applied to the storage degradation degree calculation unit 1121 of the storage degradation calculation unit 112 of the total degradation degree detection unit 110.

Sixth Embodiment

Figure 16:
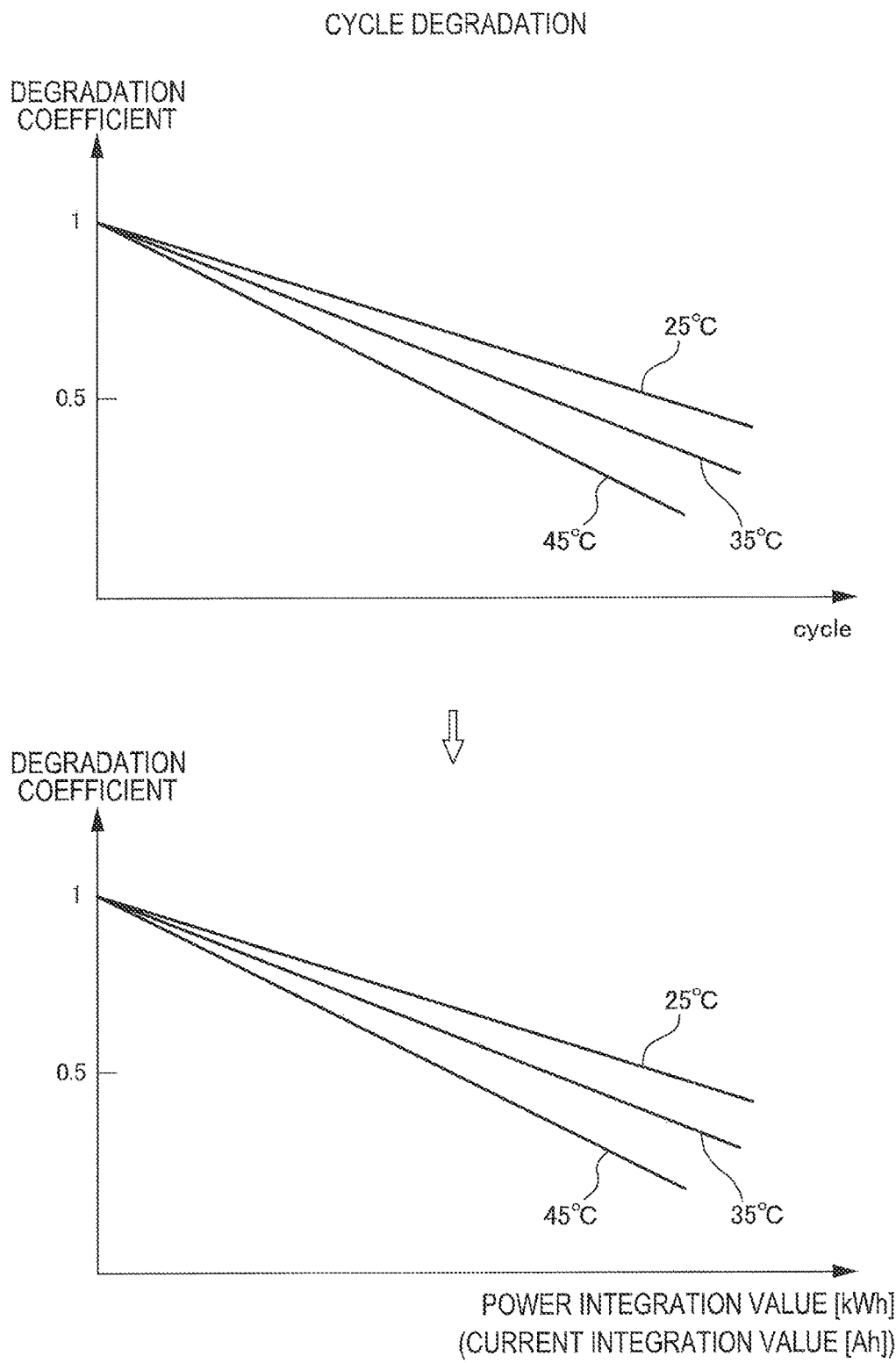
FIG. 16 is a graph showing a concept of a sixth embodiment.

FIG. 16 is a graph showing a concept of a sixth embodiment.

As described above, a degree of progress of cycle degradation is associated with the number of charges and discharges (cycle) and, besides that, sensitive to temperature. For example, as shown in FIG. 16, degradation is likely to progress as temperature increases. It should be noted that a charge/discharge number of a battery can be thought as an integration value of an output characteristic. Thus, the cycle degradation is estimated from a relationship with the integration value of the output characteristic. Accordingly, in the present embodiment, the cycle degradation is calculated, further considering a past temperature history (temperature occurrence frequency). A specific configuration is described with reference to FIG. 17.

Figure 17:
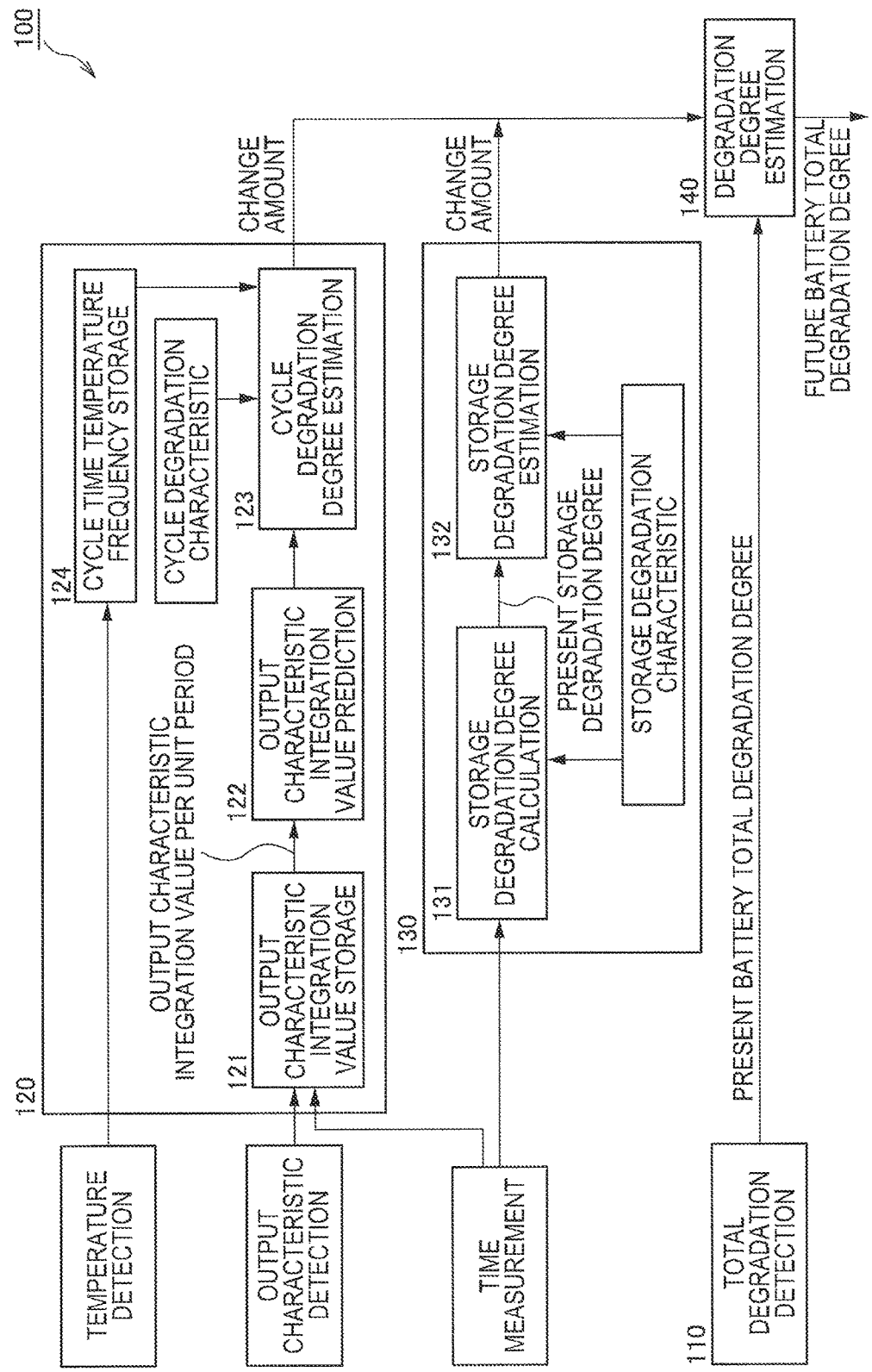
FIG. 17 is a block diagram showing control contents of the sixth embodiment of the battery degradation degree estimation device according to the present invention.

FIG. 17 is a block diagram showing control contents of the sixth embodiment of the battery degradation degree estimation device according to the present invention.

In the present embodiment, a cycle degradation estimation unit 120 further includes a cycle time temperature frequency storage unit 124 in addition to the configuration of the first embodiment. The cycle time temperature frequency storage unit 124 stores a past temperature frequency by a fixed period on the basis of temperature information output from a temperature detection unit (battery temperature sensor) and time information of a time measurement unit. Then, a cycle degradation degree estimation unit 123 corrects a cycle degradation degree using the temperature information stored in the cycle time temperature frequency storage unit 124. Specifically, the cycle degradation degree is corrected such that the cycle degradation progresses more as a high temperature frequency increases.

By doing so, temperature sensitivity serving as an important factor of the cycle degradation of the battery can be applied. Thus, the battery cycle degradation degree can be estimated with higher accuracy. As a result, a remaining life of the battery can be more accurately estimated. It should be noted that since the temperature sensitivity can be ignored in some cases depending on characteristics of the battery. Thus, the present embodiment may be appropriately applied according to the characteristics of the battery. Further, the concept of this embodiment may be applied to the cycle degradation degree calculation unit 1112 of the cycle degradation calculation unit 112 of the total degradation degree detection unit 110.

Although, the embodiments of the present invention have been described above, the above embodiments are merely application examples of the present invention and not intended to limit the technical scope of the prevent invention to the specific configurations of the above embodiments.

The above embodiments can be appropriately combined.

The invention claimed is:

1. A battery degradation degree estimation device for estimating a remaining life of a battery as accurately as possible, comprising:
a total degradation degree detection unit configured to detect a present total degradation degree of the battery;
a cycle degradation estimation unit configured to estimate a future cycle degradation degree due to charge/discharge of the battery by:
obtaining an integration value during a unit period of an output characteristic, the output characteristic being at least one of power or current;
predicting a future integration value of the output characteristic on the basis of the obtained integration value of the output characteristic; and
estimating the future cycle degradation degree on the basis of the predicted integration value of the output characteristic and a cycle degradation characteristic stored in advance, wherein
the cycle degradation characteristic relating the future cycle degradation degree to the future integration value of the output characteristic and excluding a storage degradation degree such that the future cycle degradation degree changes proportionally with the future integration value;
a storage degradation estimation unit configured to:
calculate a present storage degradation degree on the basis of a time from a reference timing up to present and a storage degradation characteristic stored in advance, wherein the present storage degradation degree is not directly proportional to time, and wherein the reference timing being a time related to a contact of electrodes of the battery with an electrolyte of the battery; and
estimate a future storage degradation degree over time inside the battery on the basis of the present storage degradation degree and the storage degradation characteristic;
a battery degradation estimation unit configured to estimate a future battery degradation degree on the basis of the present total degradation degree, the future cycle degradation degree and the future storage degradation degree; and
a life prediction unit configured to estimate the remaining life of the battery using the future battery degradation degree.

2. The battery degradation degree estimation device according to claim 1, wherein:
the integration value of the output characteristic is any of an integration value of charging power, an integration value of discharging power, an integration value of an absolute value of charging power and discharging power, an integration value of charging current, an integration value of an absolute value of charging current and discharging current.

3. The battery degradation degree estimation device according to claim 1, wherein:
the cycle degradation characteristic is such a characteristic that the cycle degradation degree increases in proportion to a charge/discharge number of the battery.

4. The battery degradation degree estimation device according to claim 1, wherein:
the storage degradation characteristic is such a characteristic that the storage degradation degree increases in proportion to a square root of time from the reference timing.

5. The battery degradation degree estimation device according to claim 1, wherein:
the total degradation degree detection unit obtains a total output characteristic integration value from a reference timing up to present, calculates a present cycle degradation degree on the basis of the obtained total output characteristic integration value and a cycle degradation characteristic stored in advance, calculates a present storage degradation degree on the basis of the time from the reference timing up to present and a storage degradation characteristic stored in advance and detects the present total degradation degree of the battery on the basis of the present cycle degradation degree and the present storage degradation degree.

6. The battery degradation degree estimation device according to claim 1, wherein to estimate the remaining life of the battery using the future battery degradation degree comprises to:
calculate a time until the future battery degradation degree estimated by the battery degradation estimation unit reaches a usage limit degradation degree determined in advance.

7. The battery degradation degree estimation device according to claim 1, comprising:
a storage unit configured to store a correlation between a traveling distance of a vehicle and an operating time until the traveling distance is reached; and
a conversion unit configured to convert a time into the traveling distance on the basis of the correlation.

8. The battery degradation degree estimation device according to claim 1, comprising:
a temperature storage unit configured to store a frequency of battery temperature within a predetermined time, wherein:
at least either one of the future storage degradation degree and the future cycle degradation degree is corrected in response to the frequency of battery temperature.

9. The battery degradation degree estimation device according to claim 8, wherein:
the temperature storage unit stores the frequency of battery temperature in the past year together with timings of occurrence in a time series manner; and
at least either one of the future storage degradation degree and the future cycle degradation degree is corrected in response to the frequency of battery temperature.

10. The battery degradation degree estimation device according to claim 1, comprising:
an SOC storage unit configured to store a frequency of battery SOC within a predetermined time, wherein:
the future storage degradation degree is corrected in response to the frequency of battery SOC.

11. A battery degradation degree estimation method, comprising:
detecting a present total degradation degree of a battery;
estimating a future cycle degradation degree due to charge/discharge of the battery by steps comprising:
obtaining an integration value during a unit period of an output characteristic, the output characteristic being at least one of power or current;
predicting a future integration value of the output characteristic on the basis of the obtained integration value of the output characteristic; and
estimating the future cycle degradation degree on the basis of the predicted integration value of the output characteristic and a cycle degradation characteristic stored in advance,
the cycle degradation characteristic relating the future cycle degradation degree to the future integration value of the output characteristic and excluding a storage degradation degree such that the future cycle degradation degree changes proportionally with the future integration value;
estimating a future storage degradation degree over time inside the battery by:
calculating a present storage degradation degree on the basis of a time from a reference timing up to present and a storage degradation characteristic stored in advance and on the basis of the calculated present storage degradation degree and the storage degradation characteristic, wherein the present storage degradation degree is not directly proportional to time;
estimating a future battery degradation degree on the basis of the present total degradation degree, the future cycle degradation degree and the future storage degradation degree; and
estimating a remaining life of the battery using the future battery degradation degree.

12. The method of claim 11, further comprising:
providing, to a user and based on the future battery degradation degree, an estimate of a number of years from a current date the battery will be degraded.

13. The method of claim 11, further comprising:
providing, to a user and based on the future battery degradation degree, an estimate of a degree of degradation of the battery in a number of years from a current date.

14. The method of claim 11, further comprising:
providing, to a user and based on the future battery degradation degree, an estimate how much the vehicle can still travel.

* * * * *